(12) United States Patent
Fotherby

(10) Patent No.: US 8,351,216 B2
(45) Date of Patent: Jan. 8, 2013

(54) LAYERED STRUCTURE CONNECTION AND ASSEMBLY

(75) Inventor: Christopher William Fotherby, Manukau (NZ)

(73) Assignee: Power Concepts NZ Limited, Manukau (NZ)

( * ) Notice: Subject to any disclaimer, the term of this patent is extended or adjusted under 35 U.S.C. 154(b) by 221 days.

(21) Appl. No.: 12/667,766

(22) PCT Filed: Jun. 10, 2008

(86) PCT No.: PCT/NZ2008/000135
§ 371 (c)(1),
(2), (4) Date: Mar. 30, 2010

(87) PCT Pub. No.: WO2009/008741
PCT Pub. Date: Jan. 15, 2009

(65) Prior Publication Data
US 2010/0195301 A1 Aug. 5, 2010

(30) Foreign Application Priority Data
Jul. 9, 2007 (NZ) .................................. 556439

(51) Int. Cl.
*H05K 7/00* (2006.01)

(52) U.S. Cl. ........ 361/775; 361/792; 361/794; 361/803; 174/250; 174/254; 174/255; 174/260; 174/261; 174/262; 174/264; 174/265; 174/266; 29/825; 29/830; 29/848; 29/852

(58) Field of Classification Search .................. 361/775, 361/792, 794, 803; 174/250, 254, 255, 260–262, 174/264–266; 29/825, 830, 848, 852
See application file for complete search history.

(56) References Cited

U.S. PATENT DOCUMENTS

| | | | | |
|---|---|---|---|---|
| 5,689,091 A | * | 11/1997 | Hamzehdoost et al. ....... | 174/255 |
| 5,949,030 A | * | 9/1999 | Fasano et al. .................. | 174/262 |
| 6,160,696 A | | 12/2000 | Bailey et al. | |
| 6,479,764 B1 | * | 11/2002 | Frana et al. .................... | 174/262 |
| 7,081,650 B2 | * | 7/2006 | Palanduz et al. .............. | 257/310 |
| 7,091,424 B2 | * | 8/2006 | Oggioni et al. ................ | 174/262 |
| 7,317,166 B2 | * | 1/2008 | Nakamura ..................... | 174/262 |
| 7,360,308 B2 | * | 4/2008 | Oggioni et al. ................. | 29/852 |
| 7,372,143 B2 | * | 5/2008 | Nakamura et al. ............. | 257/698 |
| 7,394,027 B2 | * | 7/2008 | Kaluzni et al. ................ | 174/262 |
| 7,404,250 B2 | * | 7/2008 | Cheng et al. .................... | 29/852 |
| 7,508,079 B2 | * | 3/2009 | Higashi ......................... | 257/774 |
| 7,549,222 B2 | * | 6/2009 | Nakamura ..................... | 29/852 |

(Continued)

OTHER PUBLICATIONS

Xiaoming Li et al., Development of a Three-Phase Three-Level Inverter for an Electric Vehicle, Darwin, Australia: Australasian Universities Power Enginering Conference, 1999, pp. 247-251.

(Continued)

*Primary Examiner* — Xiaoliang Chen
(74) *Attorney, Agent, or Firm* — Dann, Dorfman, Herrell and Skillman, P.C.

(57) ABSTRACT

The present invention relates to a layered structure assembly (1) for a DC to AC inverter comprising: a first layered structure (10) with first (12) and second (13) conductive layers, a second layered structure (14) with third (16) and fourth (17) conductive layers, and at least one connector (21) providing a low resistance/inductance interconnection between layered structures (10, 14), the connecter (21) comprising a rod (23) inside a sleeve (26).

7 Claims, 4 Drawing Sheets

U.S. PATENT DOCUMENTS

| | | | |
|---|---|---|---|
| 7,868,257 B2 * | 1/2011 | Kushta et al. | 174/262 |
| 8,084,695 B2 * | 12/2011 | Hsu et al. | 174/262 |
| 2002/0105774 A1 * | 8/2002 | Wermer et al. | 361/311 |
| 2002/0153167 A1 * | 10/2002 | Miller | 174/261 |
| 2003/0205406 A1 * | 11/2003 | Wermer et al. | 174/260 |
| 2004/0069529 A1 * | 4/2004 | Oggioni et al. | 174/262 |
| 2005/0099762 A1 * | 5/2005 | Wermer et al. | 361/500 |
| 2005/0178585 A1 * | 8/2005 | Kim et al. | 174/262 |
| 2006/0288574 A1 * | 12/2006 | Oggioni et al. | 29/852 |
| 2007/0124930 A1 * | 6/2007 | Cheng et al. | 29/852 |
| 2008/0185180 A1 * | 8/2008 | Cheng et al. | 174/266 |
| 2009/0133913 A1 * | 5/2009 | Kushta et al. | 174/260 |

OTHER PUBLICATIONS

International Preliminary Report on Patentability, PCT/NZ2008/000135, date of issuance Jan. 12, 2010.

* cited by examiner

Plan View

Section A-A

LAYERED STRUCTURE CONNECTION AND ASSEMBLY

FIELD OF THE INVENTION

The present invention relates to the interconnection of layered structures such as PCBs and/or laminated busbars, and in particular, the interconnection of layered structures supporting DC to AC inverter components.

BACKGROUND OF THE INVENTION

FIG. 1 shows the circuit of a DC to AC inverter suitable for converting a source of DC power to a standard mains electrical AC voltage and frequency. The inverter is of a general type well known in the art where a DC to DC converter utilising a high frequency transformer steps up the voltage of the source of DC power to a higher DC voltage, which in turn is converted to a mains voltage AC output by means of pulse width modulation (PWM) followed by low pass filtering.

In the field of DC to AC inverters it is common for the DC power source to be a 12V, 24V, or 48V battery and for the inverter output to be a 230V 50 Hz or 115V 60 Hz AC voltage. Almost all these inverters use some form of switching circuit in conjunction with a transformer to step up the relatively low DC input voltage to the level required to produce the AC output. The switching circuit produces rapidly changing currents that cannot be supplied from the battery because of the inductance of the battery connection leads. To supply these currents, a capacitor bank is normally connected across the DC supply connections inside the inverter enclosure. Aluminium electrolytic capacitors are almost always used for the capacitor bank. In the sizes required for all but the smallest inverters these capacitors are available with either leads designed to be placed through holes in a printed circuit board (PCB) and soldered to the PCB conductors, or with screw terminals that allow the capacitor to be connected to the PCB conductors by screws passing through holes in the PCB. Sometimes laminated busbars are used to connect the capacitors in the capacitor bank together. These are produced by a different process to that used for PCBs, but functionally they are the same as both can be used to produce conducting layers separated by an insulator and both have similar interconnectivity resistance and inductance properties.

Power losses can occur in various portions of the inverter, including due to the use and interconnection of multiple PCBs and/or laminated busbars. It is desirable to minimise losses as much as possible in order to improve the efficiency of the inverter.

SUMMARY OF THE INVENTION

It is the object of the present invention to reduce at least some of the power losses of a DC to AC inverter during operation.

In one aspect the present invention may be said to consist in a layered structure assembly for a DC to AC inverter comprising: a first layered structure with first and second conductive layers on opposing sides, one or both of the conductive layers comprising or adapted for supporting components of a circuit, a second layered structure with third and fourth conductive layers on opposing sides, one or both of the conductive layers comprising or adapted for supporting components of a circuit, wherein the first and second layered structures are arranged such that the second conductive layer is at least partially facing the third conductive layer, and at least one connector providing a connection between the first conductive layer and the fourth conductive layer, and a connection between the second conductive layer and the third conductive layer, the connector comprising: a rod electrically connected to the first conductive layer and extending from the first layered structure to the second layered structure, the rod also being electrically connected to the fourth conductive layer, and a sleeve mounted around the rod and extending between the first and second layered structures and being electrically connected to the second conductive layer and the third conductive layer, wherein the rod and sleeve are separated by a minimal gap to reduce the inductance of the connection.

Preferably the assembly comprises one or more additional layered structures, wherein for each additional layered structure the assembly comprises: at least one connector providing a connection between conductive layers of one of the first or second layered structures and corresponding conductive layers on the additional layered structure, the connector comprising: a rod electrically connected to an outer conductive layer of the first or second layered structure and extending from the first or second layered structure to the additional layered structure, the rod being electrically connected to the corresponding outer conductive layer of the additional layered structure, and a sleeve mounted around the rod and extending between the first or second layered structure and the additional layered structure and electrically connected to the inner conductive layer of the first or second layered structure and the corresponding inner conductive layer of the additional layered structure, wherein the rod and sleeve are separated by a minimal gap to reduce inductance of the connection.

Preferably one of more of the layered structures comprise more than two conductive layers supported on or in a corresponding substrate of the layered structure, corresponding conductive layers of the layered structure comprising internal connections.

Preferably the assembly has one or more additional portions on each layered structure, each portion comprising conductive layers interconnected with connectors as defined above.

Preferably one or more of the conductive layers of a layered structure are connected to one or more other conductive layers of that layered structure wherein the internal connections are vias positioned close to a connector.

In another aspect the present invention may be said to consist in a DC to AC inverter comprising a layered structure assembly, the assembly comprising: a first layered structure with first and second conductive layers on opposing sides, one or both of the conductive layers comprising or adapted for supporting components of a circuit, a second layered structure with third and fourth conductive layers on opposing sides, one or both of the conductive layers comprising or adapted for supporting components of a circuit, wherein the first and second layered structures are arranged such that the second conductive layer is at least partially facing the third conductive layer, and at least one connector providing a connection between the first conductive layer and the fourth conductive layer, and a connection between the second conductive layer and the third conductive layer, the connector comprising: a rod electrically connected to the first conductive layer and extending from the first layered structure to the second layered structure, the rod also being electrically connected to the fourth conductive layer, and a sleeve mounted around the rod and extending between the first and second layered structures and being electrically connected to the second conductive layer and the third conductive layer, wherein the rod and sleeve are separated by a Minimal gap to reduce the inductance of the connection.

In another aspect the present invention may be said to consist in a layered structure assembly for a DC to AC inverter comprising: a first layered structure with first and second conductive layers, a second layered structure with third and fourth conductive layers, and at least one connector providing a low resistance/inductance interconnection between layered structures, the connecter comprising a rod inside a sleeve.

In another aspect the present invention may be said to consist in a layered structured assembly or a DC to AC inverter comprising a layered structured assembly as above wherein one or more of the layered structures is a PCB and the remaining layered structures are laminated busbars.

In another aspect the present invention may be said to consist in a layered structured assembly or a DC to AC inverter comprising a layered structured assembly as above wherein one or more of the layered structures is a laminated busbar and the remaining layered structures are PCBs.

In another aspect the present invention may be said to consist in a PCB assembly for a DC to AC inverter comprising: a first PCB with first and second conductive layers on opposing sides, one or both of the conductive layers comprising or adapted for supporting components of a circuit, a second PCB with third and fourth conductive layers on opposing sides, one or both of the conductive layers comprising or adapted for supporting components of a circuit, wherein the first and second PCBs are arranged such that the second conductive layer is at least partially facing the third conductive layer, and at least one connector providing a connection between the first conductive layer and the fourth conductive layer, and a connection between the second conductive layer and the third conductive layer, the connector comprising: a rod electrically connected to the first conductive layer and extending from the first PCB to the second PCB, the rod also being electrically connected to the fourth conductive layer, and a sleeve mounted around the rod and extending between the first and second PCBs and being electrically connected to the second conductive layer and the third conductive layer, wherein the rod and sleeve are separated by a minimal gap to reduce the inductance of the connection.

In another aspect the present invention may be said to consist in a laminated busbar assembly for a DC to AC inverter comprising: a first laminated busbar with first and second conductive layers on opposing sides, one or both of the conductive layers comprising or adapted for supporting components of a circuit, a second laminated busbar with third and fourth conductive layers on opposing sides, one or both of the conductive layers comprising or adapted for supporting components of a circuit, wherein the first and second laminated busbar are arranged such that the second conductive layer is at least partially facing the third conductive layer, and at least one connector providing a connection between the first conductive layer and the fourth conductive layer, and a connection between the second conductive layer and the third conductive layer, the connector comprising: a rod electrically connected to the first conductive layer and extending from the first laminated busbar to the second laminated busbar, the rod also being electrically connected to the fourth conductive layer, and a sleeve mounted around the rod and extending between the first and second laminated busbars and being electrically connected to the second conductive layer and the third conductive layer, wherein the rod and sleeve are separated by a minimal gap to reduce the inductance of the connection.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

The term "comprising" as used in this specification means "consisting at least in part of". Related terms such as "comprise" and "comprised" are to be interpreted in the same manner.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting

BRIEF DESCRIPTION OF THE DRAWINGS

Preferred embodiments of the invention will now be described with reference to the accompanying drawings, of which.

DETAILED DESCRIPTION OF PREFERRED EMBODIMENTS

The present invention relates to a DC to AC inverter comprising a layered structure assembly, the assembly comprising two or more interconnected layered structures. A layered structure is adapted to support and/or interconnect components of a circuit. A layered structure could be a printed circuit board (PCB) or laminated bulbar, for example.

Figure 1:
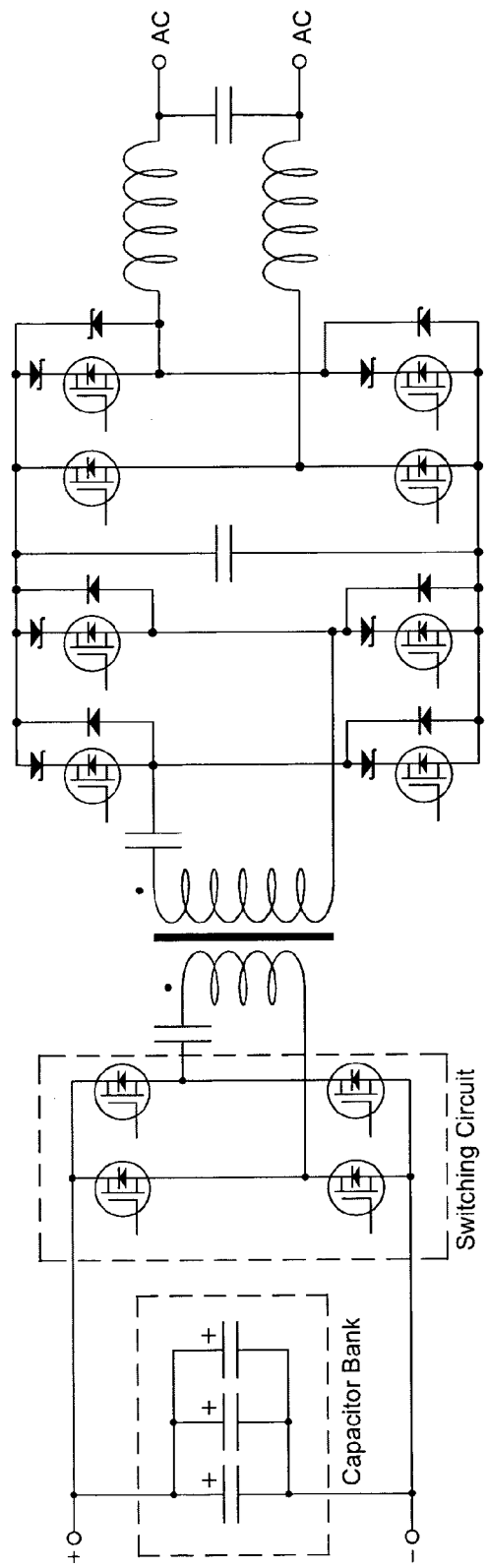
FIG. 1 is a circuit diagram of a prior art DC to AC inverter.

Referring to FIG. 1, for a high power inverter, the size of the capacitor bank PCB (or other layered structure) can become significant. Placing the switching circuit on the same PCB would increase its size to the point where it becomes unwieldy and consequentially difficult to manufacture and difficult to service. This is especially true if the switching circuit is constructed using surface mount devices as these tend to produce PCBs that are lower profile but larger in area than the same circuit using leaded devices. A single large PCB will occupy the same volume as two PCBs stacked parallel to each other where each comprises part of the circuit.

However, the present inventor has determined that a stacked approach will normally produce a more useful unit as it is often the maximum dimension of a unit that governs how much room it occupies rather than its volume. If the inverter contains more than one power module able to convert the DC supply voltage to an AC output voltage, it is possible for all the modules to share the same capacitor bank, but placing all the modules on the same PCB as the capacitor bank would further increase the manufacturing and service problems: Having separate PCBs for each power module makes the inverter easier to manufacture and significantly improve its serviceability. A single faulty module could be easily removed and worked on separately, or a faulty module could be quickly replaced by a working one.

In order to be able to connect together two or more PCBs, which are part of the low voltage DC power path of an inverter, it is important that the connections have a sufficiently low resistance and inductance. If the resistance is too high the connection will heat up and reduce the efficiency of the inverter. If the inductance is too high, then each time the switching circuit forces a rapid change in the current flowing from the capacitor bank the energy stored in the inductance of the connections will be dissipated in the switching devices and a decaying current oscillation will be produced which may cause radio frequency interference. The dissipation of the stored energy will reduce the efficiency of the inverter.

The present invention allows low voltage DC power connections between two or more layered structures in an inverter where the connections have a low resistance, a low inductance, and are easy to assemble and disassemble. The layered structure assembly of the present invention allows for low resistance and inductance between interconnected layered structures, thus allowing the use of such layered structures in DC to AC inverters. The benefit of the resulting advantages can then be obtained.

The present invention will be described in relation to PCBs, but it will be appreciated that this description can equally apply to other layered structure assemblies using laminated busbars, or a combination of PCBs and laminated busbars. The drawings depict, in schematic form, a layered structure that could either be a PCB, laminated busbar, or combination thereof. In general, a layered structure comprises a substrate, and conductive layers on opposing sides for supporting and interconnecting components.

Figure 2A:
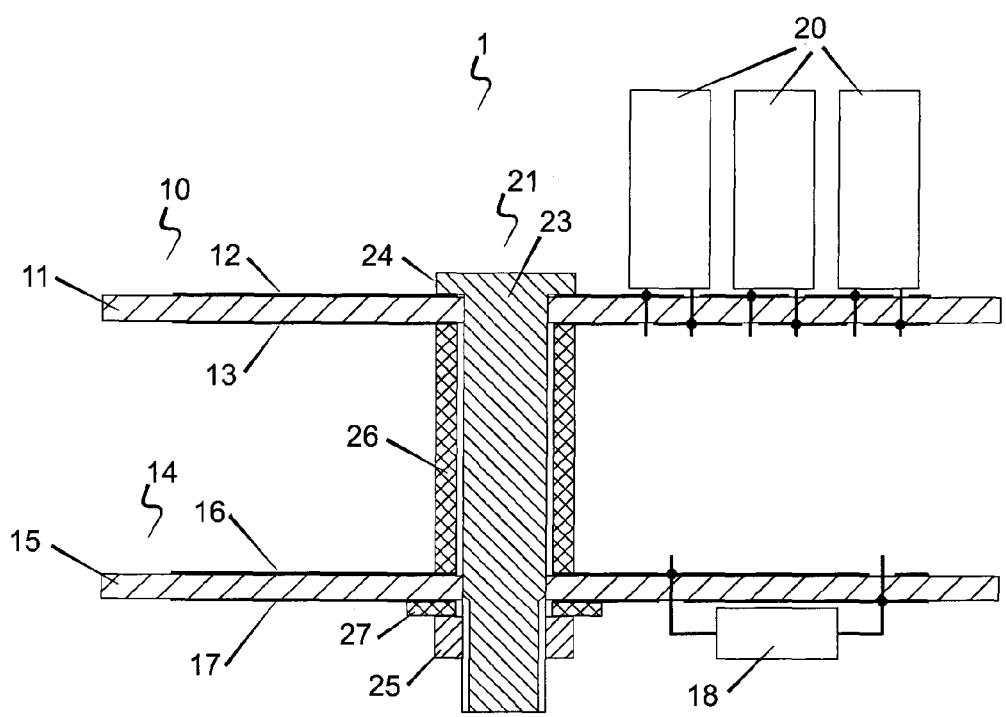
FIG. 2A is a schematic diagram of two interconnected layered structures such as PCBs or laminated busbars in accordance with an embodiment of the invention, the layered structures supporting some components of the inverter.

FIG. 2A shows a portion of two interconnected printed circuit boards (PCB) that provide an interconnected PCB assembly 1 in accordance with one embodiment of the invention. The PCB assembly 1 supports components of an electrical circuit for a DC to AC inverter, and provides a low-inductance and high current interconnection between one or more components on a first PCB and one or more components on a second PCB in order to reduce power losses in the DC to AC inverter electrical circuit. The actual components on a PCB for a DC to AC inverter are not shown (for clarity reasons), as these will be known to those skilled in the art. However, the PCB could support components such as shown in FIG. 1, for example. In a practical inverter design, the input reservoir capacitor would comprise a bank of electrolytic capacitors. It is desired that the connections between the bank of capacitors and the switching circuit be made in a low-inductance manner. Any energy stored in the inductance of these connections when the power switches in the switching circuit are turned off will be dissipated in the power switches and degrade the efficiency of the inverter.

More particularly, the embodiment shown in FIG. 2A shows a first PCB 10 comprising a substrate 11 formed of a first sheet of insulating material. The first PCB 10 comprises first conductive layer 12 and a second conductive layer 13 for electrically interconnecting components of the circuit supported by the assembly 1. These conductive layers 12, 13 are disposed on opposing sides of the first PCB. In this case, a bank of capacitors 20 that form part of the DC to AC inverter circuit are mounted on the first PCB with connections to both conductive layers 12, 13. It will be appreciated that the components could be mounted on either or both sides of the first PCB and connected to either or both conductive layers 12, 13.

The assembly 1 also shows a second PCB 14 comprising a substrate 15 formed of a second sheet of insulating material. The second PCB 14 comprises a third conductive layer 16 and a fourth conductive layer 17 for electrically interconnecting components of the circuit supported by the assembly 1. In this case, switches 18 that form part of the DC to AC inverter circuit are mounted on the second PCB with connections to both conductive layers 16, 17. It will be appreciated that the components could be mounted on either or both sides of the second PCB and connected to either or both conductive layers 16, 17.

The first and second PCBs 10, 14 are arranged in an at least partial overlapping manner, such that the second 13 and third 16 conductive layers are facing each other. This allows for interconnection of the two PCBs by a connector. Preferably, the PCBs are arranged in a parallel manner.

The first conductive layer 12 of the first PCB 10 and the fourth conductive layer 17 of the second PCB 14 could be termed "outer conductive layers". Similarly, the second conductive layer 13 of the first PCB 10 and the third conductive layer 16 of the second PCB 14 could be termed "inner conductive layers".

The switches 18 and capacitors 20 require a high current, low inductance interconnection to enable operation with reduced power losses. In the preferred embodiment, the first and second PCBs 10, 14 are interconnected by a coaxial connector 21. By this it is meant that the connector has an inner member surrounded by an outer member. The members might not have their axes exactly coaxially located. The coaxial connector 21 inserts between respective apertures of the first and second PCBs 10, 14 to facilitate interconnection. Each PCB 10, 14' could have a number of respective apertures for allowing a plurality of coaxial connectors to make parallel connections between the conductive layers 12, 13, 16, 17, thus further reducing the inductance and increasing the current capacity of the interconnection between PCBs 10, 14. Only one set of apertures and respective coaxial connector are shown for illustrative purposes. The description relates to one section of a PCB assembly. A PCB assembly 1 could contain multiple such sections as described.

The coaxial connector 21 comprises a conductive rod 23, preferably copper, with a head 24 on one end larger in diameter than the rod 23. The rod 23 may or may not be hollow. The rod is threaded at the other end for threading into a corresponding conductive nut 25, which also forms part of the connector 21. The coaxial connector 21 further comprises a cylindrical tube or sleeve 26 of conductive material, also preferably copper. The outside diameter of the rod 23 is just slightly smaller than the inside diameter of tube 26 to allow the rod to be inserted therein. The smaller the gap the smaller the inductance provided by the connector 21. The gap is made as small as practicably possible to improve the advantage provided by the coaxial connector. For example, the rod outside diameter could be 12 mm, the inside diameter of the tube 26 could be 12.1 mm and the tube 26 length could be 30 mm. This provides a connection inductance of 1.66 nH per connection. These dimensions are illustrative only, and other dimensions that achieve a desired result are possible.

The connector 21 might also have a washer 27, preferably a Belleville washer or other spring washer, to take up length variations caused by thermal expansion and contractions of the insulating substrates 11, 15 when the connector is installed.

The components of the coaxial connector 21 are installed in the apertures of the respective PCBs 10, 14 in order to make a low-inductance high current interconnection to form the assembly 1. The rod 23 is inserted through the aperture in the first PCB 10 until the head 24 is in electrical contact with the first conductive layer 12. The tube 26 is slid over the rod 23 on the other side of the first PCB 10 until it electrically contacts the second conductive layer 13 of the first PCB 10.

The gap between the rod 23 and the sleeve 26 is as small as possible to reduce inductance. Optionally, an insulating material can be placed in the gap between the rod 23 and the sleeve 26 to stop the two from shorting. This could be a insulating sleeve, or a layer of adhesive tape, for example. If the rod 23 and/or the tube 26 are coated with an insulating material, this step is not required.

The second PCB 14 is passed over the end of the rod 23 until the third conductive layer 16 of the second PCB 14 electrically contacts the sleeve 26. This sleeve 26 provides an electrical connection between the second conductive layer 13 of the first PCB 10 and the third conductive layer 16 of the second PCB 14. The washer 27 is optionally put in place on the outer side of the second PCB 14 so that it electrically contacts the fourth conductive layer 17. The conductive nut 25 is then threaded onto the rod 23 and screwed in place to retain the connector 21 components in place, and electrically connect the first conductive layer 12 of the first PCB 10 to the fourth conductive layer 17 of the second PCB 14 via the rod 23 and the nut 25. Where no washer 27 is used, the nut 25 can be screwed for direct electrical connection between the rod 23 and fourth conductive layer 17 of the second PCB 14.

At high frequencies, the current flows in a thin layer on the outside of the rod 23 and in a thin layer on the inside surface of the tube 26.

Other mechanical variations are possible. For example, both ends of the connector could be threaded and have a nut, instead of a head 24 on one end.

Multiple connectors could connect the two PCBS 10, 14 to increase current carrying capacity and to reduce inductance of the connection in the assembly 1 to a desired value.

It will be appreciated that the components of the connector 21 could be installed on the PCBs 10, 14 in a different manner to provide the same end assembly.

Figure 2B:
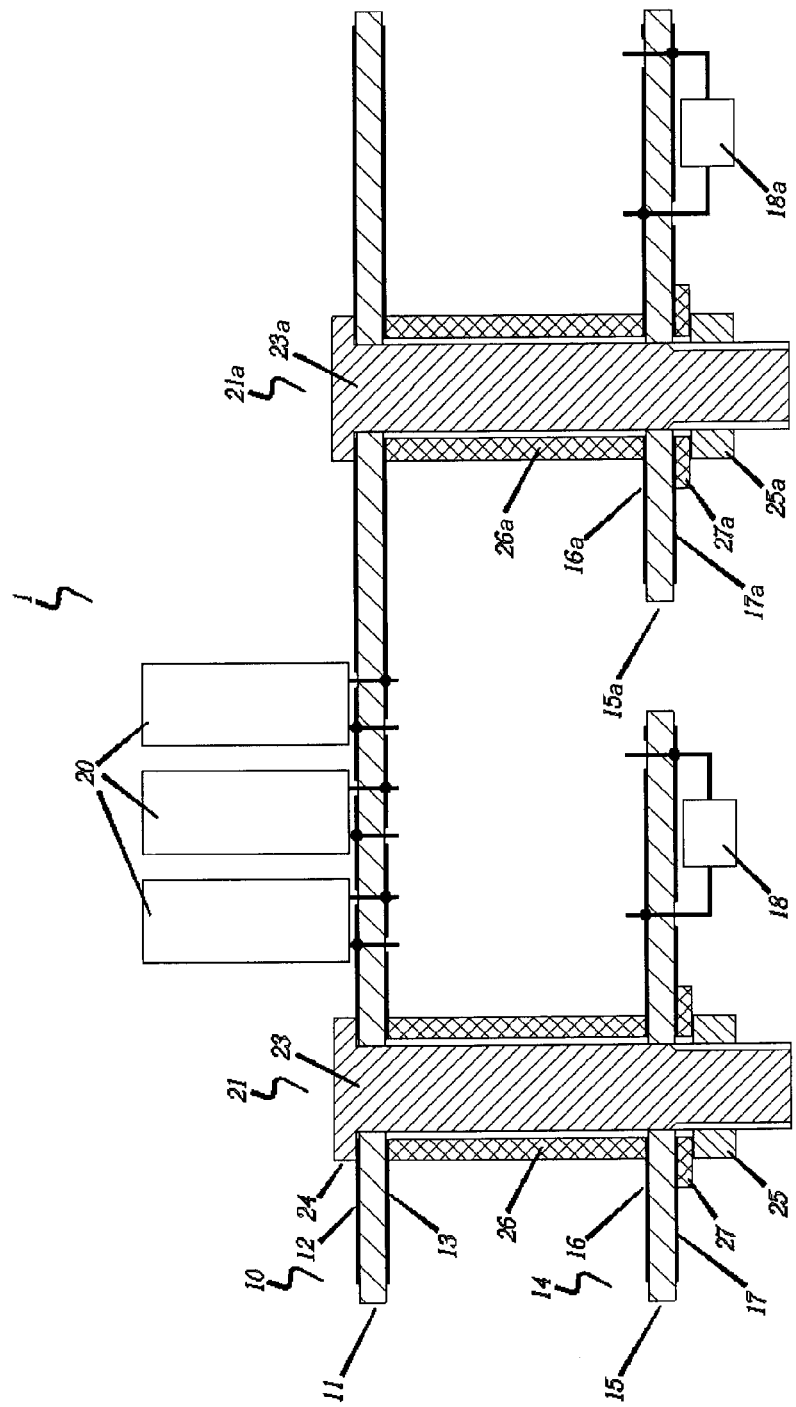
FIG. 2B is a schematic diagram of three interconnected layered structures such as PCBs or laminated busbars in accordance with an embodiment of the invention, the layered structures supporting some component of the inverter.

More than two PCBs could be connected together in this manner, such as shown in FIG. 2B. A connection using another connector 21a (comprising a rod 23a and sleeve 26a) could be made between the outer layer 12 of one of the PCBs 11 above and the outer layer 17a of an additional PCB 15a. A connection could also be made using the additional connector 21a between the inner layer 13 of the existing PCB 11 and the inner layer 16a of the additional PCB 17a, being the layers that face each other. Inner and outer layers are defined with respect to the coaxial connector 21a. A layer that is an inner layer with respect to one coaxial connector may be an outer layer with respect to a different coaxial connector. An additional nut 25a, and washer 27a, along with components 18a can be utilised as described above. PCBs constructed with more than two conductive layers could be connected together.

In another embodiment, one or both PCBs can comprise more than two conductive layers. For example, four layers could be used. For a particular PCB, the first conductive layer is on one side of the PCB, and the fourth conductive layer is on the opposing side of the PCB. The second and third conductive layers are embedded within the PCB—the second layer being adjacent to the first layer and the third layer being adjacent to the fourth layer. The second conductive layer is electrically connected to the fourth conductive layer, and the third conductive layer is electrically connected to the first conductive layer. Two or more such PCBs can be connected together using the connector described previously. If the first and third conductive layers of a PCB are connected together in close proximity to the components mounted on the PCB and are also connected together in close proximity to the connector, then the resistance between the components and the connector will be less than if a single conductive layer is used. A lower resistance results in a higher current carrying capacity. Connecting the second and fourth conductive layers in the same manner further reduces the resistance between the components and the connector, further increasing the current carrying capacity. If two conductive layers carry currents in opposite directions, then the inductance of the layers can be reduced by positioning the layers closer together. Connecting the first conductive layer to the third conductive layer and connecting the fourth conductive layer to the second conductive layer gives the lowest inductance configuration for a four layer PCB.

Figure 3:
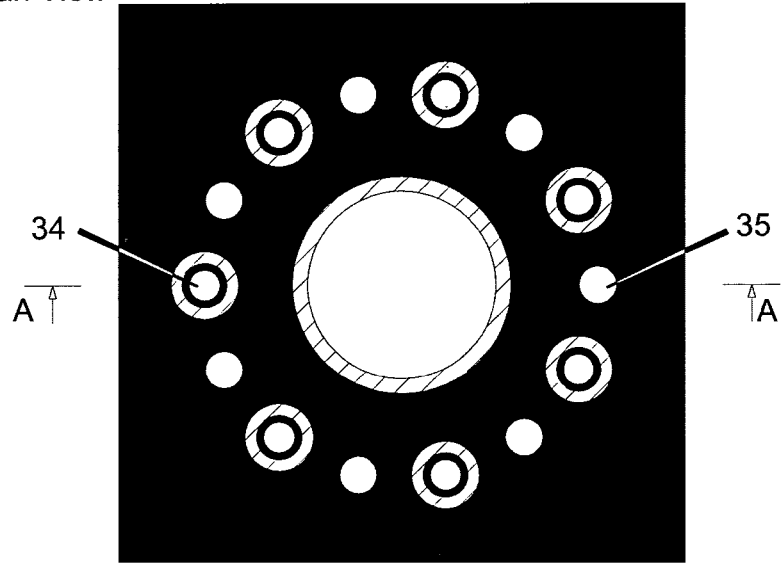
FIG. 3 is a schematic diagram showing an alternative embodiment having a layered structure with more than two layers.
Figure 3:
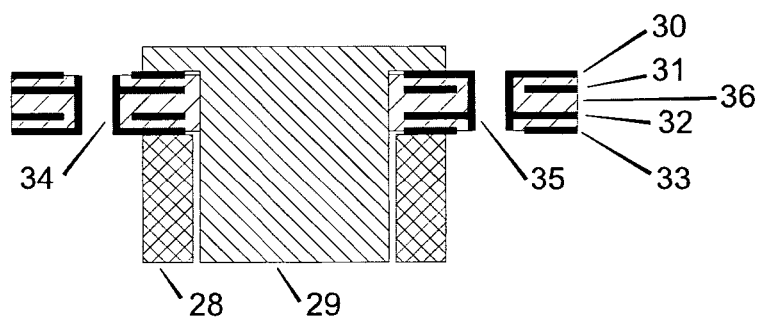

FIG. 3 shows plan and section views of one embodiment of the invention where at least one of the PCBs of the PCB assembly is constructed with four conductive layers 30-33. In particular, the plan view in FIG. 3 shows that the aperture in the PCB that receives the rod 29 of the connector is surrounded at close proximity by a plurality of inter-layer connections e.g. 34, 35 known to those skilled in the art of PCB design as vias. The other end of the connector and other PCB it is connected to are not shown for clarity. It will be appreciated that the interconnection takes place in a similar manner to that described in relation to FIG. 2. Each via has an inductance and a resistance and placing many vias in parallel will provide an interconnection between layers that has less inductance and greater current carrying capacity than a single via.

The section view in FIG. 3 shows first and fourth conductive layers 30, 33 located on opposite sides of a sheet of insulating material 36, and second and third conductive layers 31, 32 embedded within the sheet of insulating material 36. Also shown is one end of a coaxial connector comprising an inner rod 29 and an outer sleeve 28. In particular, the first conductive layer 30 is connected to the third conductive layer 32 by via 35 and the second conductive layer 31 is connected to the fourth conductive layer 33 by via 34. For illustrative purposes, the plan view of FIG. 3 shows seven vias with the same construction as via 34 and seven with the same construction as 35. A larger or smaller number of vias can be used. The vias illustrated are known as through vias and are the most common type of via and the simplest to manufacture. Those skilled in the art will recognise that other types of vias could be used. Those skilled in the art will also be able to determine how to design PCBs of more than four layers that would be suitable for constructing a PCB assembly according to the principles disclosed herein.

A typical two layer PCB is 1.6 mm. thick. If a four layer PCB also had a total thickness of 1.6 mm, for example, and had a 0.16 mm insulating sheet between layers one and two, and between layers three and four, then the inductance of the four layer PCB will be more than 20 times lower than the two layer PCB.

It will be appreciated that use of the terms "first conductive layer", "second conductive layer" etc. is simply for labelling purposes only, and is for the distinguishing of different layers. The terms "first", "second" etc. used in respect of conductive layers are interchangeable and each term could be applied to any of the layers arbitrarily. That is, the layers described could equally be relabelled in some other manner. The terms "first", "second" etc. should not be considered to imply any order or sequence of how the layers are arranged.

The preceding drawings and descriptions are for illustrative purposes only. It is not intended that the invention disclosed herein be limited to PCBs with either two or four layers, or with a specific number of vias, or to PCB assemblies with PCBs of the same construction at each end of the coaxial connectors.

An embodiment with one or more PCBs comprising more than two layers is not limited to using four layers or limited to using an even number of layers. In all cases interleaving layers connected to the layer on one side of the PCB with layers connected to the layer on the other side of the PCB will produce the lowest inductance PCB, but other configurations may produce a useful reduction in inductance.

In an alternative embodiment, the tube might not fully surround the rod, but rather have an open side. In this case, a sleeve could be used, which has an open side.

The invention claimed is:

1. A layered structure assembly for a DC to AC inverter comprising:
    a first layered structure with first and second conductive layers on opposing sides, one or both of the conductive layers comprising or adapted for supporting components of a DC to AC inverter circuit,
    a separate second layered structure with third and fourth conductive layers on opposing sides, one or both of the conductive layers comprising or adapted for supporting components of a DC to AC inverter circuit,
    wherein the first and second layered structures are arranged such that the second conductive layer is at least partially facing the third conductive layer, and
    at least one removable connector providing a connection between the first conductive layer and the fourth conductive layer, and a connection between the second conductive layer and the third conductive layer, the removable connector comprising:
        a rod electrically connected to the first conductive layer via a low resistance, high current electrical connection and extending from the first layered structure to the second layered structure, the rod also being electrically connected to the fourth conductive layer via a low resistance, high current electrical connection, and
        a sleeve assembled around the rod and extending between the first and second layered structures and being electrically connected to the second conductive layer via a low resistance, high current electrical connection and the third conductive layer via a low resistance, high current electrical connection,
    at least one mechanical fastener coupled to the rod to apply pressure to retain the rod and sleeve to the layered structures and provide the low resistance, high current electrical connections, and
    wherein the rod and sleeve are separated by a minimal gap to reduce the inductance of the connection.

2. The layered structure assembly according to claim 1 comprising one or more additional layered structures, wherein for each additional layered structure the assembly comprises:
    at least one additional removable connector providing a connection between conductive layers of one of the first or second layered structures and corresponding conductive layers on the additional layered structure, the connector comprising:
        an additional rod electrically connected to an outer conductive layer of the first or second layered structure and extending from the first or second layered structure to the additional layered structure, the rod being electrically connected to the corresponding outer
        an additional sleeve mounted around the rod and extending between the first or second layered structure and the additional layered structure and electrically connected to the inner conductive layer of the first or second layered structure and the corresponding inner conductive layer of the additional layered structure,
    wherein the rod and sleeve are separated by a minimal gap to reduce inductance of the connection.

3. The layered structure assembly according to claim 1 wherein one of more of the layered structures comprise more than two conductive layers supported on or in a corresponding substrate of the layered structure, corresponding conductive layers of the layered structure comprising internal connections.

4. The layered structure assembly according to claim 1 with one or more additional portions on each layered structure, each portion comprising conductive layers interconnected with connectors as defined in claim 1.

5. The layered structure assembly according to claim 3 wherein one or more of the conductive layers of the first or second layered structure are connected to one or more other conductive layers of the first or second layered structure wherein the internal connections are vias positioned close to the connector of the first or second layered structure.

6. A layered structured assembly or a DC to AC inverter comprising a layered structured assembly according to claim 1 wherein one or more of the layered structures is a PCB and the remaining layered structures are laminated busbars.

7. A layered structured assembly or a DC to AC inverter comprising a layered structured assembly according to claim 1 wherein one or more of the layered structures is a laminated busbar and the remaining layered structures are PCBs.

* * * * *